United States Patent
Yabuki et al.

(10) Patent No.: US 6,705,004 B1
(45) Date of Patent: Mar. 16, 2004

(54) METHOD AND APPARATUS FOR MOUNTING ELECTRONIC PART

(75) Inventors: Koichi Yabuki, Nara (JP); Yoshiyuki Nagai, Toyonaka (JP); Keiji Hanada, Hirataka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/937,915

(22) PCT Filed: Mar. 29, 2000

(86) PCT No.: PCT/JP00/01983

§ 371 (c)(1),
(2), (4) Date: Oct. 1, 2001

(87) PCT Pub. No.: WO00/59282

PCT Pub. Date: Oct. 5, 2000

(30) Foreign Application Priority Data

Mar. 30, 1999 (JP) ............................................... 11/88500

(51) Int. Cl.⁷ ................................................. H05K 3/30
(52) U.S. Cl. ............................. 29/834; 29/720; 29/740; 29/832; 29/840
(58) Field of Search .......................... 29/834, 720, 721, 29/740, 741, 832, 833, 840

(56) References Cited

U.S. PATENT DOCUMENTS

| | | | | |
|---|---|---|---|---|
| 5,383,270 A | * | 1/1995 | Iwatsuka et al. | 29/840 |
| 5,854,745 A | * | 12/1998 | Muraoka et al. | 700/58 |
| 5,992,013 A | * | 11/1999 | Morita | 29/833 |

FOREIGN PATENT DOCUMENTS

| | | |
|---|---|---|
| JP | 5-343889 | 12/1993 |
| JP | 6-188594 | 7/1994 |
| JP | 6-244598 | 9/1994 |

* cited by examiner

*Primary Examiner*—Carl J. Arbes
*Assistant Examiner*—Tim Phan
(74) *Attorney, Agent, or Firm*—Jordan and Hamburg LLP (57) ABSTRACT

During the process of transporting an electronic component (18) to a substrate (10) after a suction nozzle (7) has picked up the component (18), the component (18) being supplied from a component supply unit (1), the amount of offset of the component (18) with respect to the suction nozzle (7) is calculated. The feasibility of mounting the component (18) held by the suction nozzle (7) onto the substrate (10) without hindrance is determined from the amount of offset. If the result of the determination is positive, the component (18) is mounted onto the substrate (10).

5 Claims, 7 Drawing Sheets

METHOD AND APPARATUS FOR MOUNTING ELECTRONIC PART

CROSS REFERENCE TO RELATED DOCUMENT

The present application is a 371 of PCT/JP00/01983, which was filed on Mar. 29$^{th}$ 2000, which claims the benefit of Japanese Patent Application No. 11-88500, filed Aug. 30$^{th}$ 1999.

TECHNICAL FIELD

The present invention relates to a method and apparatus for mounting electronic components such as a microchip or a semiconductor element onto a substrate. More particularly, the invention relates to a component mounting method and apparatus which employs a suction nozzle for holding and mounting a component onto a given area on a substrate.

BACKGROUND ART

In a conventional electronic component mounting apparatus, the speed of the mounting operation has been increased by raising the operating speed of the various drive units in order to cope with a demand for high-speed component mounting due to an increase in the number of components to be mounted. For example, in a component mounting apparatus shown in diagrammatic plan view in FIG. 6, a component supply table 2 on which a plurality of component supply units 1 are arranged is moved in the direction of arrangement of the component supply units 1, so as to locate a component supply port 3 of a desired component supply unit 1 in position at a first station ST1 for picking up components (not shown). A component supply unit 1, known as a parts cassette, includes a holding tape (not shown) having recesses for storing electronic components, the recesses being arranged at intervals in the length direction of the holding tape, and a cover tape (not shown) stuck onto the upper surface of the holding tape, the cover tape used for preventing the electronic components from falling out, thereby supplying the components to the component supply port 3 continuously.

Figure 6:
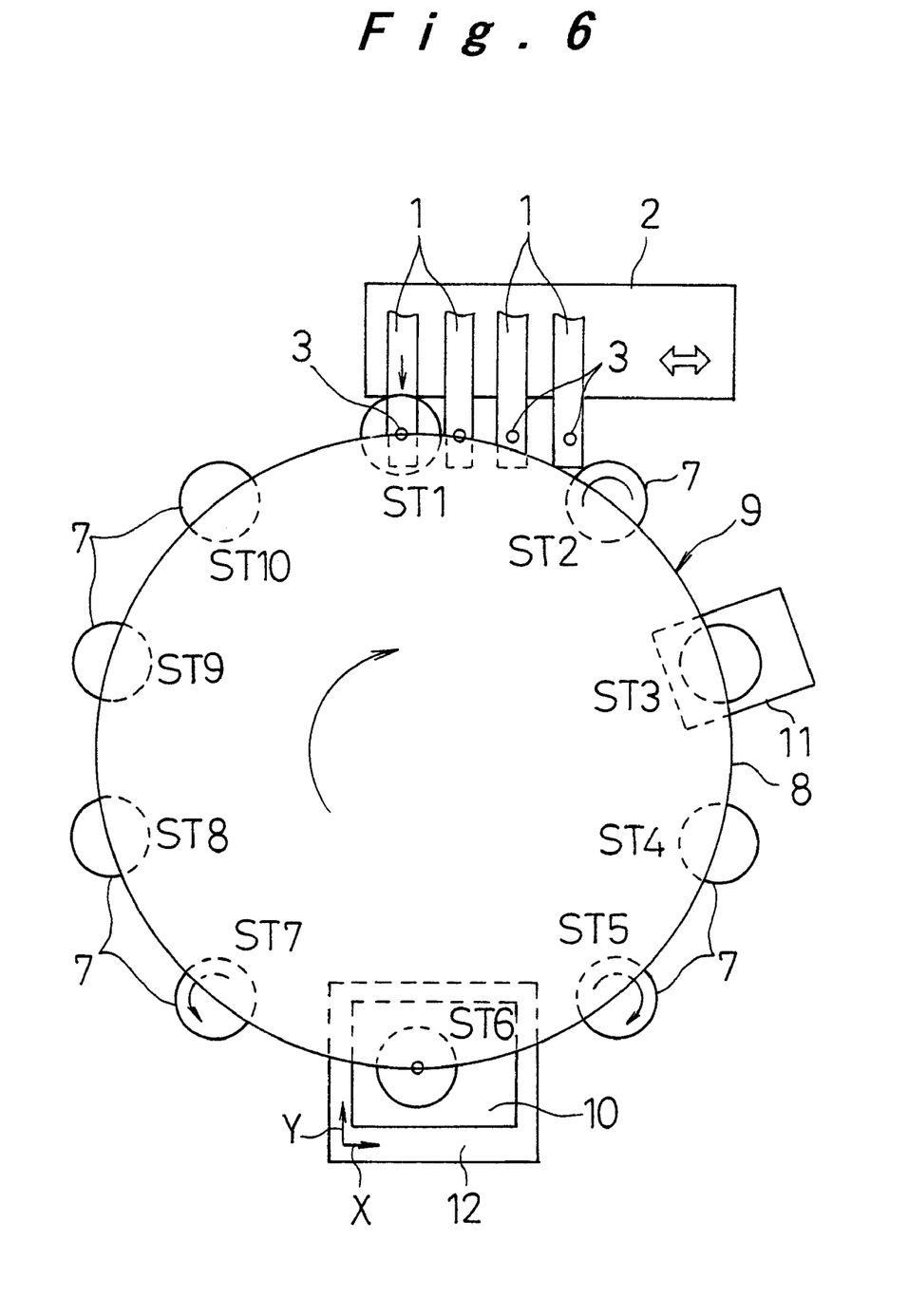
FIG. 6 is a diagrammatic plan view of an electronic component mounting apparatus having a rotary-type mounting head.

The component mounting apparatus also includes a rotary-type mounting head 9. The mounting head 9 includes a rotary drum 8 having a plurality of nozzle units (not shown) equipped with a suction nozzle 7 (ten are shown by way of example in the Figure) at their bottom ends, the nozzle units arranged at equal intervals on the periphery of the drum 8.

The components are mounted onto a substrate 10 by the following procedure: the rotary drum 8 is intermittently rotated through an angle corresponding to the interval of the nozzle units, whereby the suction nozzles 7 of the nozzle units are successively positioned at first to tenth stations ST1 to ST10. By vertical movement of the nozzle unit, the suction nozzle 7 positioned at the first station ST1 picks up an electronic component from a component supply port 3 of a component supply unit 1. When the component held by the suction nozzle 7 is transported with the rotation of the rotary drum 8 and the nozzle 7 is positioned at a third station ST3 for component recognition, the amount of positional offset of the component with respect to the center of the suction nozzle 7 and the position of the component itself are measured using image data picked up by a recognition camera (not shown) of a component recognition device 11. Then, when the component reaches a fifth station ST5 for position correction, the component is rotated by the nozzle unit by the amount of the offset in order to correct the offset of the component calculated by the image processing described above.

When the component is positioned in and stopped at a sixth station ST6 for component mounting, a substrate 10 is located by moving a substrate holding table 12 in X and Y directions so that a desired component mounting area of the substrate 10 is positioned directly below the component held by the suction nozzle 7. Then, the nozzle unit moves vertically, whereby the component held by the suction nozzle 7 is mounted onto the desired mounting area on the substrate 10. In the seventh to tenth stations ST7 to ST10, preparation for next component mounting such as replacement of the suction nozzle 7 is performed.

As typified by cellular phones, recent reduction in weight and thickness of electronic devices necessitates miniaturization of the substrate 10 which is accommodated therein, as well as mounting of smaller components with high density on the substrate. However, reduction of separation of adjacent components is limited by the mechanical structure of the electronic component mounting apparatus. The mounting precision of the electronic component mounting apparatus is scarcely a factor in restricting the reduction of separation of the components, since they are mounted on the substrate 10 after their position has been corrected in the fifth station ST5 in accordance with the correction values calculated from the image data picked up at the third station ST3.

Figure 7:
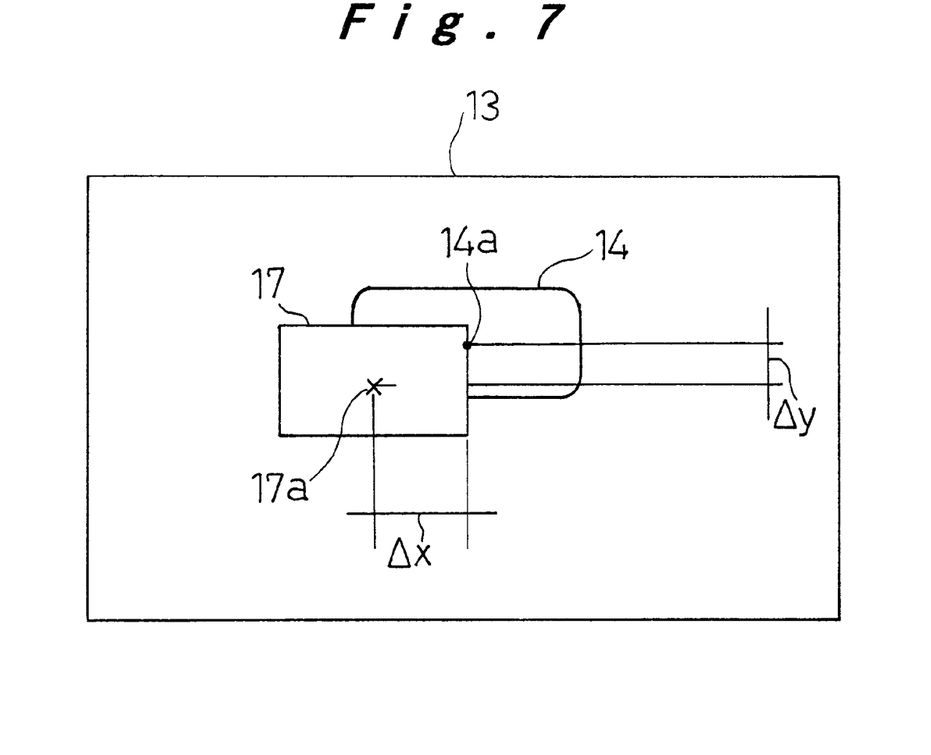
FIG. 7 is an explanatory view diagrammatically showing a recognition image obtained by a component recognition device of the electronic component mounting apparatus.

FIG. 7 is a diagrammatical recognition screen 13 which is picked up by the recognition camera of the component recognition device 11 at the third station ST3. Using this recognition screen 13, the amount of offset ($\Delta x$, $\Delta y$) of the positional coordinates ($x_1$, $y_1$) of the center 17a of the image 17 of the component held by the suction nozzle 7 with respect to the positional coordinates (x, y) of the center 14a of the image 14 of the suction nozzle 7, and the inclination of the electronic component with respect to the suction nozzle 7 are calculated. A correction value is calculated based on the data, and the position of the component is corrected in accordance with the correction value before it is mounted on the substrate 10. Due to the improvement in resolution of the component recognition device, there is no particular problem in reducing the mounting separation of the components.

Figure 8:
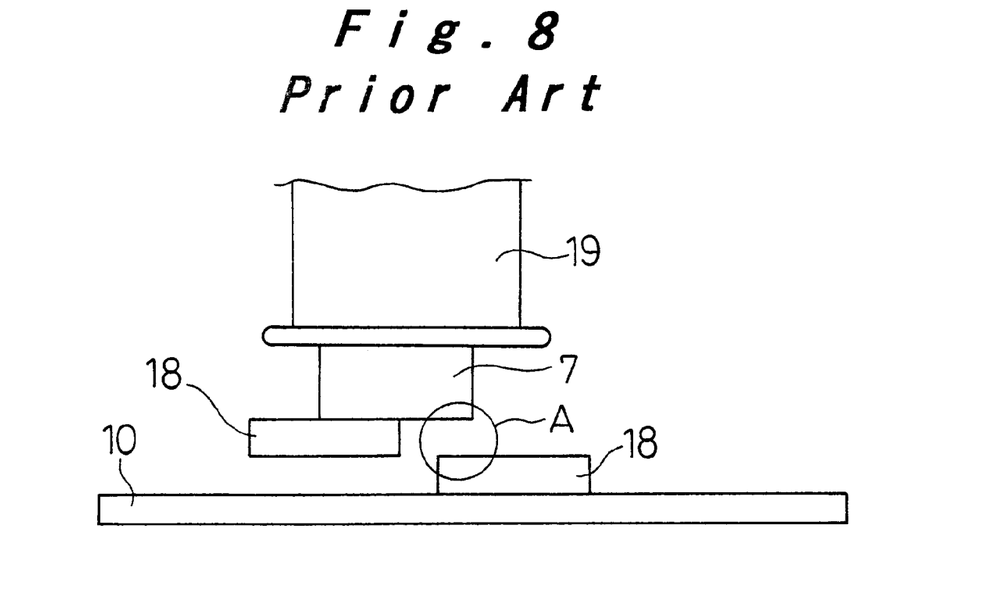
FIG. 8 is a side view illustrating the problem of the conventional method of mounting electronic components.

However, regarding the mechanical structure of the electronic component mounting apparatus, there is a problem as shown in FIG. 8. When the nozzle unit 19 holding a component 18 with a suction nozzle 7, the component 18 being in a positionally offset condition and corrected to face a given component mounting area of the substrate 10, is lowered, the suction nozzle 7 may come into contact with a component 18 that has already been mounted in an adjacent position as shown at portion A, thereby damaging this component 18 and impairing the quality of the substrate 10.

In order to avoid the problem, a suction nozzle 7 may have an extremely minute shape that it does not contact a previously mounted component 18. However, the smaller the aperture of the suction nozzle 7 becomes, the lower the suctional force on a component 18 is, causing an increase in the rate of failure in picking up a component 18, as well as an increase in the number of components 18 that are discarded due to the failure, and consequent economic loss. What is worse, the strength of the suction nozzle 7 is lowered due to increasing thinness of its outer wall, resulting in an increased frequency of maintenance of the suction nozzle 7 and increased costs.

The invention has been devised in the light of the above problems, and it is an object of the invention to provide a method and apparatus for mounting electronic components realizing the mounting of components at high densities on substrates employing a conventional suction nozzle without lowering the quality of the substrate due to damage of the components.

DISCLOSURE OF THE INVENTION

To achieve the above object, a component mounting method according to the present invention includes the following steps: an electronic with a suction nozzle and transported to above a substrate; the amount of offset of the component with respect to the suction nozzle is calculated; the feasibility of mounting the component held by the suction nozzle onto the substrate without hindrance is determined based on the amount of offset; and a component in respect of which the result of the determination is positive is mounted on the substrate.

According to the component mounting method, high quality of the substrates is achieved since the component held by the suction nozzle is arranged to be mounted on the substrate only when the amount of offset of the component is of such a degree that the suction nozzle face the substrate without hindrance during the mounting operation.

Preferably, the feasibility of mounting the component held by the suction nozzle on the substrate without hindrance is determined as follows: a range of the substrate, the range being faced by the suction nozzle when a component held by the suction nozzle is mounted is determined from the amount of offset of the component; whether or not the range overlaps an electronic component that is already mounted adjacent to the position where the component held by the suction nozzle is to be mounted is judged; and a component in respect of which the result of the judgment is positive is mounted on the substrate.

Accordingly, when it is judged that if a component held by the suction nozzle were to be mounted the suction nozzle would come into contact with an already-mounted component, mounting of this component is not carried out. The damage which would be caused by contact of the suction nozzle with an already-mounted component is thus prevented, enabling substrates to have high quality.

It is also preferred that if it is judged that the range of the substrate would overlap with an electronic component already mounted, and the component currently held by the suction nozzle does not have polarity, a range of the substrate that would be faced by the suction nozzle if the component currently held by the suction nozzle were mounted on the substrate is calculated from the amount of offset that the component would have if it were rotated through 180°; the feasibility of mounting the component held by the suction nozzle onto the substrate without hindrance is determined in accordance with whether or not there would be overlap of the range of the substrate with the component already mounted adjacent to the position where the component currently held by the suction nozzle is to be mounted; and a component in respect of which the result of this determination is positive is rotated through 180° and then is mounted on the substrate.

Thereby, in addition to preventing damage caused by the suction nozzle coming into contact with an already-mounted component, the number of discarded components is greatly reduced since in cases where it is found that contact of the suction nozzle with an adjacent already-mounted component can be avoided if a component that does not have polarity is reversed, mounting is performed after rotating the component through 180°, thereby reducing the costs.

Furthermore, according to the invention, the feasibility of mounting the component currently held by the suction nozzle on the substrate without hindrance may be determined in accordance with whether or not the offset of the component with respect to the suction nozzle is smaller a pre-set value, and a component in respect of which the result of the determination is positive is mounted on the substrate.

The component mounting method of the invention has advantages in that damage caused by contact of a suction nozzle with an already-mounted component is prevented, thereby ensuring high quality of a substrate and the control processing of mounting is simplified.

An electronic component mounting apparatus according to the present invention includes a mounting head which picks up an electronic component supplied from a component supply unit using a suction nozzle, and transports and mounts the component onto a substrate; an offset amount calculating device which calculates the amount of offset of the component with respect to the suction nozzle by image recognition of the component during the process of transporting the component; and a feasibility determining device which determines the feasibility of mounting the component currently held by the suction nozzle on the substrate without hindrance based on the amount of offset; wherein the component is mounted onto the substrate if the result of the determination by the feasibility determining device is positive.

The electronic component mounting apparatus realizes the component mounting method of the invention and achieves the benefits of the component mounting method due to the provision of the feasibility determining device which determines the feasibility of mounting the component held by the suction nozzle onto the substrate without hindrance based on the amount of offset of the component with respect to the suction nozzle. Further, the apparatus is inexpensive since the feasibility of mounting is determined based on the amount of offset of the component calculated by the component recognition device employed in the conventional electronic component mounting apparatus.

BEST MODE FOR CARRYING OUT THE INVENTION

Figure 1:
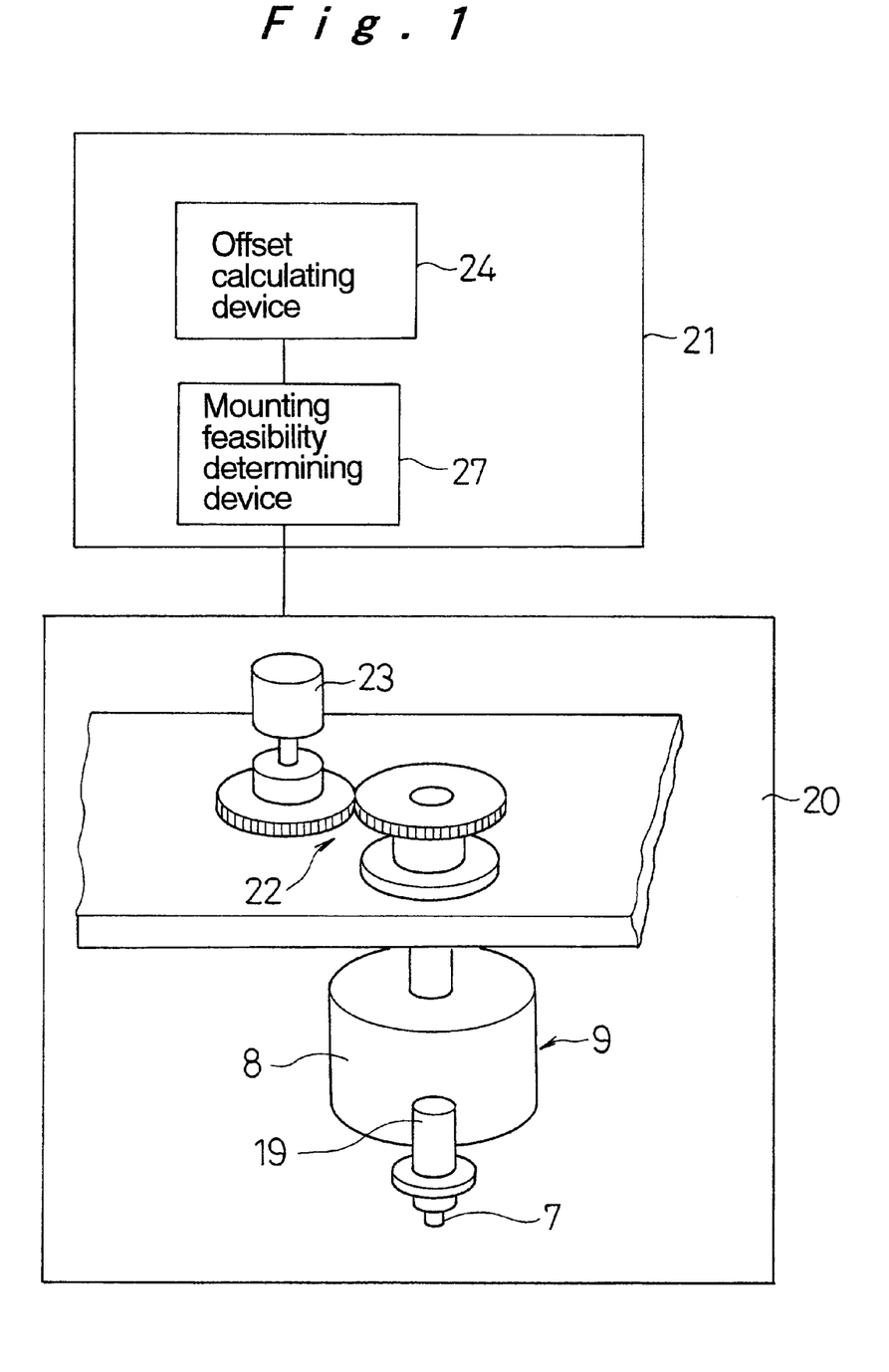
FIG. 1 is a block diagram illustrating the construction of main parts of an electronic component mounting apparatus for realizing the method of mounting electronic components according to the present invention.

Preferred modes for carrying out the invention are described with reference to the drawings. FIG. 1 is a block diagram illustrating the construction of main parts of an electronic component mounting apparatus for realizing the method of mounting electronic components according to the present invention. The component mounting apparatus includes a component mounting mechanism 20 and a control unit 21. The component mounting mechanism 20 includes a rotary-type mounting head 9 including a rotary drum 8 having a plurality (one is shown by way of examples in the Figure) of nozzle units 19 equipped with a suction nozzle 7 at their bottom ends, the nozzle units 19 being arranged at equal intervals on the periphery of the drum 8, and a driving motor 23 for rotating the mounting head 9 through a gear mechanism 22.

The control unit 21 includes an offset calculating device 24 which calculates the amount of offset of the center of an electronic component 18 with respect to the center of the suction nozzle 7 by using an image data picked up by a recognition camera of the component recognition device 11 at the third station ST3 shown in FIG. 6, and a mounting feasibility determining device 27 which determines, whether it is possible to mount the component 18 held by the suction nozzle 7 onto a substrate 10, based on the amount of offset calculated by the device 24. The conventional component recognition device 11 may double as the offset calculating device 24.

Figure 2:
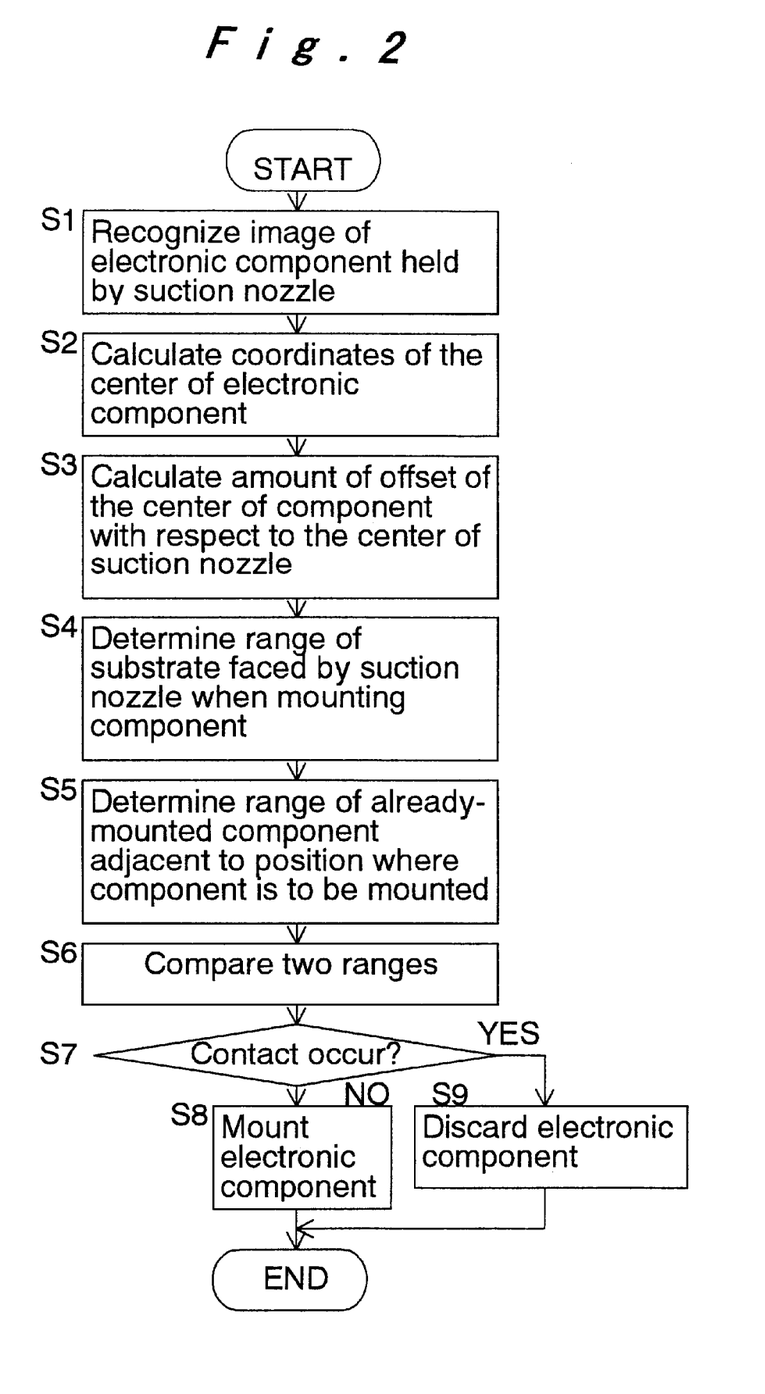
FIG. 2 is a flow chart illustrating the control processing of mounting electronic components according to a first embodiment of the invention.

Next, the flow chart of FIG. 2, illustrating control processing of mounting electronic components according to the first embodiment will be described with reference to the diagram of FIG. 3. When a suction nozzle 7 has been moved to the third station ST3 after picking up a component 18 at the first station ST1 shown in FIG. 6, the offset calculating device 24 recognizes an image 17 of the component 18 from its image data picked up by the recognition camera of the component recognition device 11 (step S1). Then, using the recognition results, the offset calculating device 24 calculates the positional coordinates $(x_1, y_1)$ of the center 17a of the image 17 of the component 18 held by the suction nozzle 7, as shown in FIG. 7 (step S2). The positional coordinates (x, y) of the center 14a of the suction nozzle 7 are recognized beforehand for each suction nozzle 7 and registered in the offset calculating device 24. The offset calculating device 24 calculates the amount of offset $(\Delta x, \Delta y)$ of the positional coordinates $(x_1, y_1)$ of the center 17a of the image 17 with respect to the positional coordinates (x, y) of the center 14a of the image 14 of suction nozzle 7, as shown in FIG. 7, by performing the calculation $(x-x_1)$ and $(y-y_1)$ (step S3).

Figure 3:
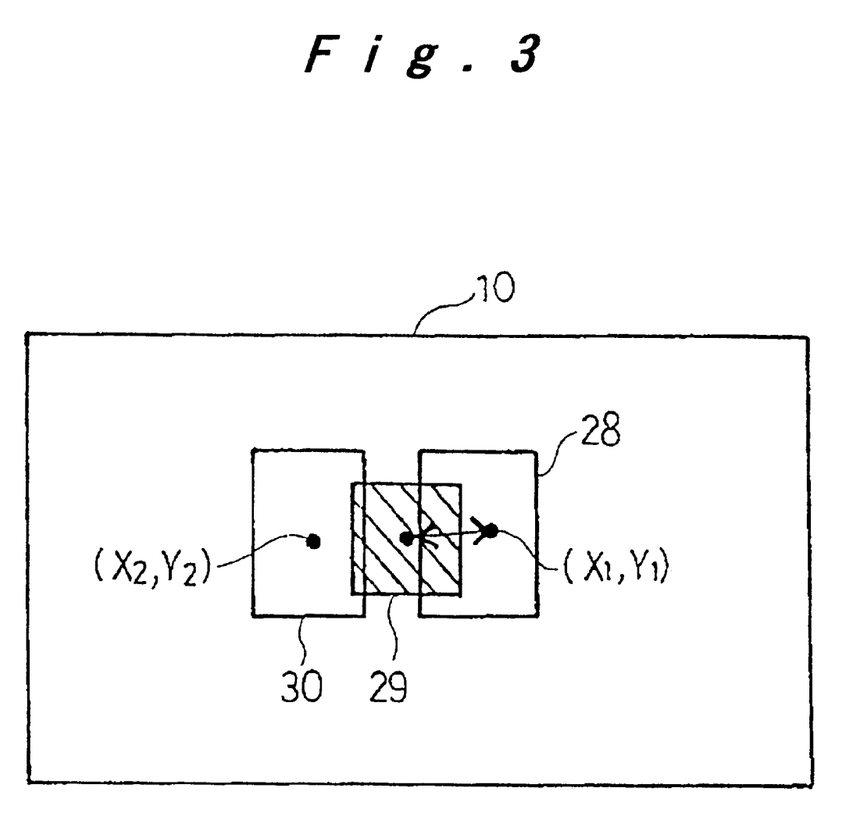
FIG. 3 is a diagram of a recognition image obtained in the first embodiment.

Next, the mounting feasibility determining device 27 determines a range 29 of the substrate 10 that is faced by the suction nozzle 7 when the component 18 is mounted (step S4), based on the amount of offset $(\Delta x, \Delta y)$ calculated by the device 24, the coordinates $(X_1, Y_1)$ of the center of the range 28 on the substrate 10 shown in FIG. 3 where a next component is to be mounted, and the area of the suction port of the suction nozzle 7. Further, the mounting feasibility determining device 27 determines a range 30 of a component 18 already mounted adjacent to the range 28 of the component 18 from the positional coordinates $(X_2, Y_2)$ of the center thereof (step S5).

Next, the mounting feasibility determining device 27 compares the range 29 of the substrate 10 which is faced by the suction nozzle 7 and the range 30 of the already-mounted component 18 (step S6), and determines whether or not there is partial overlap of the two ranges 29 and 30 i.e. whether or not the suction nozzle 7 would come into contact with the already-mounted component 18 when a mounting operation is performed (step S7). If it determines that contact would not take place, the suction nozzle 7 is moved to the sixth station ST6 of FIG. 6, the component 18 held by the suction nozzle 7 is mounted on the substrate 10 (step S8). If it is determined that contact would take place, vertical movement of the nozzle unit 19 is inhibited at the sixth station ST6, and the suction nozzle 7 is moved towards the subsequent stations ST7 to ST10 with the component 18 being held, and this component 18 is discarded by releasing the suction of the suction nozzle 7 at a prescribed position. Damage caused by the suction nozzle 7 coming into contact with an already-mounted component 18 during the mounting operation is thus prevented, thereby ensuring high quality of the substrates 10.

Figure 4:
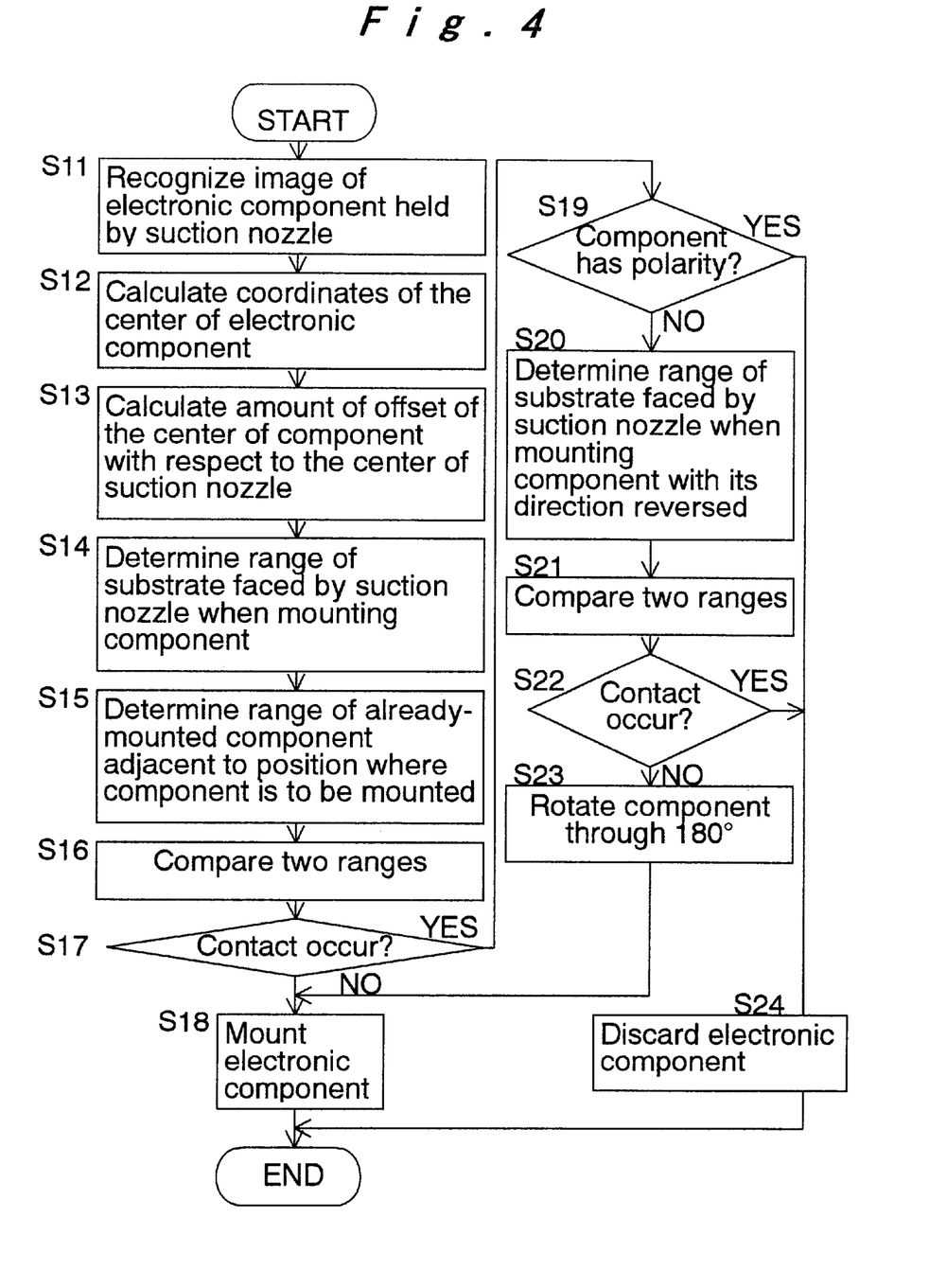
FIG. 4 is a flow chart illustrating the control processing of mounting electronic components according to a second embodiment of the invention.

FIG. 4 is the flow chart showing the control processing of mounting electronic components according to the second embodiment of the present invention; the method of mounting will now be described. When the suction nozzle 7 has moved to the third station ST3 after it has picked up a component 18, the offset calculating device 24 recognizes an image of the component 18 from its image data obtained by the component recognition device 11 (step S11). Next, the offset calculating device 24 calculates the positional coordinates $(x_1, y_1)$ of the center of the component 18 held by the suction nozzle 7, using the recognition result (step S12). The offset calculating device 24 calculates the offset $(\Delta x, \Delta y)$ of the positional coordinates $(x_1, y_1)$ of the center of the component 18 with respect to the positional coordinates (x, y) of the center of the suction nozzle 7 by calculating $(x-x_1)$ and $(y-y_1)$ (step S13).

Next, the mounting feasibility determining device 27 determines the range 29 of the substrate 10 which is faced by the suction nozzle 7 when the component 18 is mounted (step S14), based on the offset $(\Delta x, \Delta y)$ calculated by the offset calculating device 24, the coordinates $(X_1, Y_1)$ of the center of the range 28 where the component 18 is to be mounted, and the area of the suction port of the suction nozzle 7. Further, the mounting feasibility determining device 27 determines a range 30 of the component 18 that is already mounted adjacent to the range 28 of the component 18 (step S15), based on the positional coordinates $(X_2, Y_2)$ of its center.

Next, the mounting feasibility determining device 27 compares the range 29 with the range 30 of the already-mounted component 18 (step S16), in order to determine whether or not there is partial overlap of the two ranges 29, 30 i.e. whether the suction nozzle 7 would come into contact with the already-mounted component 18 when a mounting operation is performed (step S17). If it is determined that no contact would take place, when the suction nozzle 7 is moved to the sixth station ST6, the component 18 held by the suction nozzle 7 is mounted on the substrate 10 (step S18). The above control processing is identical with that of the first embodiment.

However, if it is determined that contact would take place (step S17), it is found that whether or not the component 18 held by the suction nozzle 7 is of a type having polarity (step S19). If the component 18 does not have polarity, being able to be mounted with its direction reversed, a range of the substrate 10 that would be faced by the suction nozzle 7 when mounting the component 18 is again determined (step S20), based on the offset $(-\Delta x, -\Delta y)$ in a condition in which the offset $(\Delta x, \Delta y)$ calculated by the device 24 is rotated by 180°, the coordinates $(X_1, Y_1)$ of the center of the range 28 where the next component 18 is to be mounted, and the area of the suction port of the suction nozzle 7.

Then, the mounting feasibility determining device 27 compares the range determined at step S20 with the range 30 of the already-mounted component 18 (step S21), in order to determine whether or not there is partial overlap of the two ranges and so whether the suction nozzle 7 would come into contact with the already-mounted component 18 when a mounting operation is performed (step S22). If it is determined that no contact would take place, the suction nozzle 7 is rotated through 180° so that the component 18 is reversed (step S23) and the suction nozzle 7 is then moved to the sixth station ST6, whereupon the component 18 held by the suction nozzle 7 is mounted on the substrate 10 (step S18). If it is determined that contact would take place or that the component 18 has polarity, vertical movement of the nozzle unit 19 is inhibited at the sixth station ST6, and the nozzle unit 19 is moved to the further stations ST7 to ST10 with the suction nozzle 7 holding the component 18, and at a prescribed position, suction nozzle 7 releases the suction on the component 18, thereby discarding the component 18 (step S24).

According to the control processing of mounting electronic components described above, damage caused by the section nozzle 7 coming into contact with an already-mounted component 18 is prevented as in the first embodiment. Moreover, provided that the component 18 does not have polarity, and that the suction nozzle 7 would not come into contact with an already-mounted component 18, mounting is performed after rotating the component 18 through 180°, whereby the number of discarded components 18 is greatly reduced, and lower costs is realized.

Figure 5:
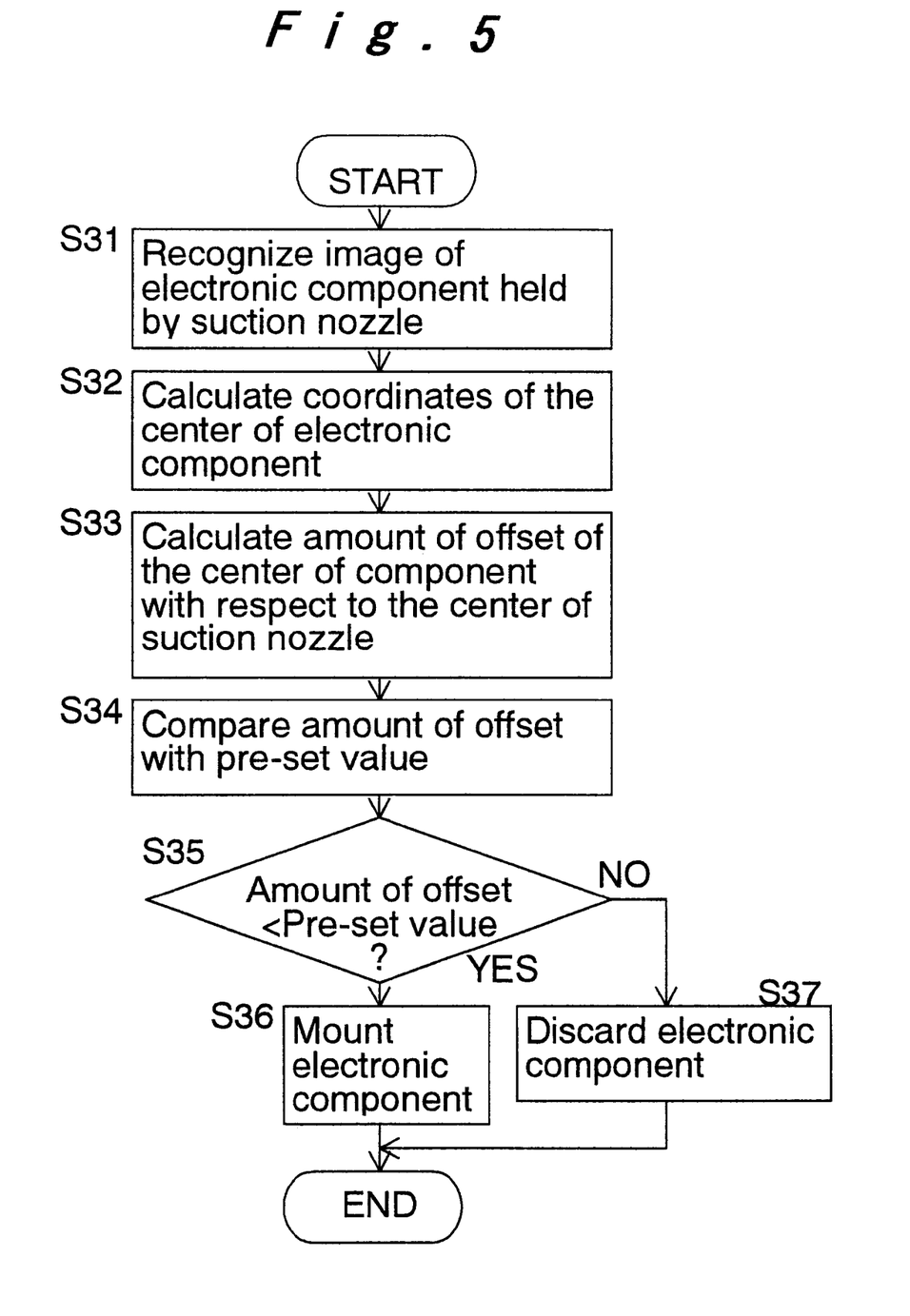
FIG. 5 is a flow chart illustrating the control processing of mounting electronic components according to a third embodiment of the invention.

FIG. 5 is the flow chart illustrating the control processing of mounting electronic components according to the third embodiment of the present invention; the method of mounting will now be described. When the suction nozzle 7 has moved to the third station ST3 after it has picked up a component 18 at the first station ST1, the offset calculating device 24 recognizes an image of the component 18 from its image data picked up by the recognition camera of the component recognition device 11 (step S31). Next, the offset calculating device 24 calculates the positional coordinates $(x_1, y_1)$ of the center of the component 18 held by the suction nozzle 7, using the recognition result (step S32). The offset calculating device 24 calculates the offset ($\Delta x$, $\Delta y$) of the positional coordinates $(x_1, y_1)$ of the center of the component 18 with respect to the positional coordinates $(x, y)$ of the center of the suction nozzle 7 by calculating $(x-x_1)$ and $(y-y_1)$ (step S33).

Then, the mounting feasibility determining device 27 compares the offset ($\Delta x$, $\Delta y$) calculated by the device 24 with a previously registered pre-set value (step S34), and determines whether or not the amount of offset ($\Delta x$, $\Delta y$) is smaller than the pre-set value (step S35). If it determines that the offset is smaller than the pre-set value, the component 18 held by the suction nozzle 7 is mounted on the substrate 10 at the sixth station ST6 (step S36). If it determines that the offset is larger than the pre-set value, vertical movement of the nozzle unit 19 is inhibited at the sixth station ST6, and the nozzle unit 19 is moved to the further stations ST7 to ST10 with the suction nozzle 7 holding the component 18, and at a prescribed position, the suction nozzle 7 releases the suction on the component 18, thereby discarding the component 18 (step S37). There is therefore the advantage that damage caused by contact of the suction nozzle 7 with an already-mounted component 18 is prevented, thereby ensuring high quality of the substrate 10, and that the control processing of mounting is simplified.

INDUSTRIAL APPLICABILITY

As described above, according to the method for mounting electronic components of the present invention, high quality is achieved in a substrate in which electronic components are mounted with high density, since a component, the offset of which with respect to the suction nozzle is of such a degree that the suction nozzle can approach the substrate without hindrance is mounted onto the substrate.

According to the electronic component mounting apparatus of the present invention provided with the mounting feasibility determining device that determines, based on the offset of the component with respect to the suction nozzle, whether or not it is feasible to mount the component held by the suction nozzle on the substrate without hindrance, the method of mounting electronic components according to the present invention is realized and the benefits of the method is obtained consequently, the present invention is useful in simultaneously achieving high-density mounting of components and prevention of lowering of quality of the substrate due to damage to the components.

What is claimed is:

1. A method of mounting an electronic component, comprising:

supplying an electronic component from a component supply unit;

picking up the electronic component with a suction nozzle;

transporting the electronic component held by the suction nozzle;

calculating an amount of offset of the electronic component with respect to the suction nozzle during the step of transporting;

determining a feasibility of mounting the electronic component held by the suction nozzle onto the substrate without hindrance of the electronic component held by the suction nozzle by another electronic component previously mounted on the substrate, based on the amount of offset; and mounting the electronic component onto the substrate conditioned upon a positive determination of the feasibility.

2. The method according to claim 1, further comprising:

calculating a range of the substrate based on the amount of offset of the electronic component, the range being faced by the suction nozzle when the electronic component held by the suction nozzle is mounted onto the substrate; and said step of determining the feasibility including a determination as to whether or not the range overlaps said another electronic component previously mounted on the substrate in a position adjacent to the position where the electronic component held by the suction nozzle is to be mounted.

3. The method according to claim 2, provided that the result of the feasibility determination is negative, further comprising:

judging whether or not the electronic component has polarity;

calculating another amount of offset of the electronic component with a direction thereof rotated through 180° with respect to the suction nozzle, provided that the component does not have polarity;

calculating another range of the substrate based on said another amount of offset, said another range being faced by the suction nozzle when the electronic component held by the suction nozzle is mounted onto the substrate;

determining the feasibility of mounting the electronic component onto the substrate without hindrance including another determination as to whether or not said another range overlaps said another electronic component that is already mounted in a position adjacent to the position where the electronic component held by the suction nozzle is to be mounted; and rotating the electronic component through 180° and mounting the electronic component onto the substrate conditioned upon said another determination being positive.

4. The method according to claim 1, wherein the feasibility of mounting the electronic component is determined by comparing the amount of offset with a pre-set value.

5. An electronic component mounting apparatus, comprising:

a mounting head for picking up and transporting an electronic component supplied from a component supply unit with a suction nozzle, the mounting head being operable for mounting the electronic component onto a substrate;

an offset calculating device for calculating the amount of offset of the electronic component with respect to the suction nozzle by image recognition of the electronic component; and a mounting feasibility determining device for determining a feasibility of mounting the electronic component held by the suction nozzle without hindrance of the electronic component held by the suction nozzle by a previously mounted component on the substrate, based on the amount of offset, wherein the electronic component is mounted on the substrate conditioned upon a determination that there will be no overlap between the component and the previously mounted component.

* * * * *